(12) United States Patent
Kim et al.

(10) Patent No.: US 9,515,272 B2
(45) Date of Patent: Dec. 6, 2016

(54) DISPLAY DEVICE MANUFACTURE USING A SACRIFICIAL LAYER INTERPOSED BETWEEN A CARRIER AND A DISPLAY DEVICE SUBSTRATE

(71) Applicants: Rohm and Haas Electronic Materials LLC, Marlborough, MA (US); Rohm and Haas Electronic Materials Korea Ltd., Chungcheongnam-do (KR)

(72) Inventors: Young Seok Kim, Shrewsbury, MA (US); Yerang Kang, Ansan (KR); Christopher D. Gilmore, Watertown, MA (US); Deyan Wang, Hudson, MA (US); Kathleen M. O'Connell, Cumberland, RI (US); Moo-Young Lee, Seongnam-si (KR); Peng-Wei Chuang, Natick, MA (US)

(73) Assignees: Rohm and Haas Electronic Materials LLC, Marlborough, MA (US); Rohm adn Haas Electronic Materials Korea Ltd. (KR)

( * ) Notice: Subject to any disclaimer, the term of this patent is extended or adjusted under 35 U.S.C. 154(b) by 0 days.

(21) Appl. No.: 14/882,992

(22) Filed: Oct. 14, 2015

(65) Prior Publication Data
US 2016/0133864 A1     May 12, 2016

Related U.S. Application Data

(60) Provisional application No. 62/078,938, filed on Nov. 12, 2014.

(51) Int. Cl.
| | | |
|---|---|---|
| *H01L 21/027* | (2006.01) |
| *H01L 21/3105* | (2006.01) |
| *H01L 21/311* | (2006.01) |
| *H01L 51/00* | (2006.01) |
| *H01L 51/56* | (2006.01) |
| *H01L 27/32* | (2006.01) |
| *C08G 79/00* | (2006.01) |
| *C23C 18/12* | (2006.01) |

(52) U.S. Cl.
CPC .......... *H01L 51/0097* (2013.01); *C08G 79/00* (2013.01); *C23C 18/122* (2013.01); *C23C 18/1295* (2013.01); *H01L 27/3244* (2013.01); *H01L 51/003* (2013.01); *H01L 51/56* (2013.01); *H01L 2227/323* (2013.01); *H01L 2227/326* (2013.01); *H01L 2251/5338* (2013.01)

(58) Field of Classification Search
CPC ............. H01L 21/0271; H01L 21/0332; H01L 21/31053; H01L 21/311; H01L 27/3244; H01L 51/0097; H01L 51/003
See application file for complete search history.

(56) References Cited

U.S. PATENT DOCUMENTS

| | | |
|---|---|---|
| 2006/0131703 A1 | 6/2006 | Majumdar et al. |
| 2008/0002118 A1 | 1/2008 | Park et al. |
| 2008/0158770 A1 | 7/2008 | Lee et al. |

(Continued)

OTHER PUBLICATIONS

Search report for corresponding European Application No. 15 19 0781 dated Mar. 8, 2016.

(Continued)

*Primary Examiner* — Thanh V Pham
(74) *Attorney, Agent, or Firm* — S. Matthew Caims

(57) ABSTRACT

A method of manufacturing a display device is provided which uses a sacrificial layer interposed between a carrier and a display device substrate.

13 Claims, 3 Drawing Sheets

(56) References Cited

U.S. PATENT DOCUMENTS

Figure 1A:
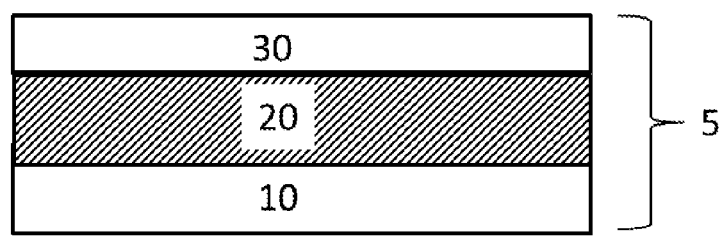

| | | |
|---|---|---|
| 2009/0298211 A1 | 12/2009 | Kim et al. |
| 2010/0255344 A1 | 10/2010 | Kim et al. |
| 2012/0043537 A1 | 2/2012 | Karpov et al. |
| 2014/0042649 A1 | 2/2014 | Ke et al. |
| 2015/0024522 A1 | 1/2015 | Wang et al. |
| 2015/0024607 A1 | 1/2015 | Wang et al. |

OTHER PUBLICATIONS

Search report for corresponding Taiwan Application No. 104136752 dated Jun. 15, 2016.

DISPLAY DEVICE MANUFACTURE USING A SACRIFICIAL LAYER INTERPOSED BETWEEN A CARRIER AND A DISPLAY DEVICE SUBSTRATE

This application claims the benefit of U.S. Provisional Application Ser. No. 62/078,938, filed on Nov. 12, 2014.

The present invention relates generally to the field of electronic device manufacture, and more specifically to the manufacture of display devices.

The current trend in the display field is for displays to be lighter, thinner, have a lower power consumption, and have good image resolution. Increasingly, there is an interest in providing flexible displays that can be rolled or folded. To be flexible, a display must have a relatively thin substrate (such as ≤1 mm), which would typically be composed of a plastic material or a thin metal layer, such as a metal foil. Current display manufacturing processes start with a suitable substrate, which is subjected to various processing steps as a display device is built. Substrates suitable for use in flexible displays do not have sufficient integrity on their own to support the various layers of materials used in the manufacture of displays. One solution utilizes a carrier for the flexible substrate. Suitable carriers, such as glass or metal, are self supporting and are able to withstand the process conditions employed. However, the thin device substrates employed make it is difficult to remove the finished flexible display device from the carrier without damaging the finished display device.

U.S. published patent application 2009/0298211 discloses a method for manufacturing a flexible display in which a metal-containing sacrificial layer having an absorptivity of 1 E+02 to 1E+06, such as indium tin oxide (ITO), indium zinc oxide (IZO), or gallium indium zinc oxide (GIZO), is formed on a front side of a substrate support, such as a glass sheet. A flexible substrate is next formed on the sacrificial layer, and then devices are formed on the flexible substrate. The flexible substrate is delaminated from the substrate support by irradiating the back side of the substrate support using a laser having a wavelength of 308 nm and removing the flexible substrate. After the flexible substrate is removed, the substrate support cannot be reused or recycled for use in the process as the metal-containing sacrificial layer is not easily removed from the front side of the substrate support. Also, vapor deposition methods, such as chemical vapor deposition (CVD), are conventionally used to deposit ITO, IZO or GIZO layers on such substrate supports, which requires specialized deposition equipment. There remains a need for a method of manufacturing flexible displays where the flexible display substrate can be readily removed from a substrate support, and that allows the substrate support to be reused, and that does not require specialized vapor deposition equipment.

The present invention addresses one or more of the deficiencies of conventional flexible display manufacturing processes. Specifically, the present invention provides a method of manufacturing a display device comprising: (a) providing a carrier substrate; (b) disposing a layer of an organic coating on a surface of the carrier substrate; (c) disposing a layer of one or more oxymetal precursor materials on the organic coating layer, wherein the oxymetal precursor material comprises one or more metal atoms and one or more ligands; (d) curing the layer of oxymetal precursor material to an oxymetal layer; (e) forming a flexible substrate layer on the oxymetal layer; (f) forming one or more devices on the flexible substrate layer; and (g) separating the flexible substrate layer from the carrier substrate.

Further provided by the present invention is a display device structure comprising: a carrier substrate; an organic coating layer disposed on a surface of the carrier substrate; an oxymetal layer disposed on a surface of the organic coating layer; a flexible substrate disposed on a surface of the oxymetal layer; and one or more devices formed on the flexible substrate layer.

FIGS. 1A-1D are cross-sectional representations illustrating the structure and process of the invention.

As used throughout this specification, the following abbreviations shall have the following meanings, unless the context clearly indicates otherwise: ° C.=degree Celsius; g=gram; nm=nanometer; μm=micron=micrometer; mm=millimeter; sec.=second; min=minute; hr.=hour; DI=deionized; and mL=milliliter. All amounts are percent by weight ("wt %") and all ratios are molar ratios, unless otherwise noted. All numerical ranges are inclusive and combinable in any order, except where it is clear that such numerical ranges are constrained to add up to 100%.

The articles "a", "an" and "the" refer to the singular and the plural, unless the context clearly indicates otherwise. As used herein, the term "and/or" includes any and all combinations of one or more of the associated listed items. "Alkyl" refers to linear, branched and cyclic alkyl unless otherwise specified. "Aryl" refers to aromatic carbocycles and aromatic heterocycles. The term "oligomer" refers to dimers, trimers, tetramers and other polymeric materials that are capable of further curing. By the term "curing" is meant any process, such as polymerization or condensation, that increases the molecular weight of a material or composition. "Curable" refers to any material capable of being cured under certain conditions. The terms "film" and "layer" are under interchangeably through this specification. "(Meth) acrylate" includes "methacrylate" and "acrylate". The term "copolymer" refers to a polymer composed of 2 or more different monomers as polymerized units.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. When an element is referred to as being "disposed on" another element, it can be directly on the other element or intervening elements may be present therebetween. In contrast, when an element is referred to as being "disposed directly on" another element, there are no intervening elements present.

Display devices, such as flexible display devices, are manufactured according to a method comprising: (a) providing a carrier substrate; (b) disposing a layer of an organic coating on a surface of the carrier substrate; (c) disposing a layer of one or more oxymetal precursor materials on the organic coating layer, wherein the oxymetal precursor material comprises one or more metal atoms and one or more ligands; (d) curing the layer of oxymetal precursor material to form an oxymetal layer; (e) forming a flexible substrate layer on the oxymetal layer; (f) forming one or more devices on the flexible substrate layer; and (g) separating the flexible substrate layer from the carrier substrate. As used herein, the term "flexible" refers to a substrate, a device, or a layer of material that is capable of repeatedly (such as, at least 25,000 times) being formed to a radius of ≤2 mm, and preferably ≤1 mm, such as being folded, without damage, such as cracking, delamination, crease formation, or other loss of function. The term "display device" includes a device capable of displaying an image as well as any subcomponent thereof. As used herein, the term "image" refers to a graphic, text, video, and any other visual representation. As used herein, the term "oxymetal layer" refers to a layer or film comprising predominantly metal-oxygen bonds, for example, -M-O-M-O-M- where M is a metal. An "oxymetal precursor material" is any material that can be used to form an oxymetal layer upon processing under certain conditions, such as by heating.

In the present process, a layer of an organic coating is disposed on a surface of a carrier substrate. The carrier substrate surface having the layer of organic coating disposed on it is referred to the front surface or front side. Any suitable carrier substrate may be used in the present invention. Suitable carrier substrates include plastics such as polyimide or polycarbonate, silicon-containing materials such as silicon wafers, silsesquioxane materials, and glass, ceramic, metal, and the like. The carrier substrate is transparent to any wavelength of actinic radiation used during the delamination step, and preferably, the carrier substrate is glass. The organic coating may be disposed directly on the front surface of the carrier substrate. Optionally, an adhesion promoting layer is first disposed on the front surface of the carrier substrate, and the organic coating layer is disposed directly on the adhesion promoting layer. Adhesion promoters for organic coatings are well-known in the art. Any suitable adhesion promoter for the selected organic coating may be used in the present process. Such optional adhesion promoters may be disposed on the carrier substrate by any suitable method.

A wide variety of organic coatings may be used in the present process. Such organic coatings are polymeric. As used herein, the term "polymeric" includes "oligomeric". Preferably, the organic coating is oligomeric. Suitable organic coatings are those able to withstand subsequent processing conditions, and are transparent to subsequent actinic radiation used to separate (delaminate) the flexible display device from the carrier substrate. Exemplary polymeric materials useful as organic coating layers in the present invention include, without limitation: arylene polymers, such as polyphenylene materials and arylcyclobutene-based polymers, arylene ether polymers, imide polymers, siloxane polymers, styrene polymers, (meth)acrylate polymers, isobenzoxazole polymers, imide-benzoxazole polymers, and mixtures thereof. Such polymeric materials may be homopolymers or copolymers. Preferably, the organic coating layer is composed of arylene polymers, arylene ether polymers, imide polymers, siloxane polymers, styrene polymers, isobenzoxazole polymers, imide-benzoxazole polymers, and mixtures thereof, more preferably arylene polymers, arylene ether polymers, imide polymers, siloxane polymers, isobenzoxazole polymers, imide-benzoxazole polymers, and mixtures thereof, and yet more preferably arylene polymers, arylene ether polymers, imide polymers, siloxane polymers, imide-benzoxazole polymers, and mixtures thereof. It will be appreciated by those skilled in the art that various other polymeric materials may suitably be used as the organic coating layers in the present invention. Such polymeric materials are generally commercially available, or may be prepared by various known methods.

Preferred arylene polymers are polyphenylene polymers sold under the SiLK™ brand, and suitable arylcyclobutene-based polymers are those sold under the CYCLOTENE™ brand, both available from The Dow Chemical Company. Suitable arylene polymers include those disclosed in U.S. Pat. No. 5,965,679 and in Stille et al., *Macromolecules*, vol. 1, no. 5, September-October 1968. Suitable siloxane polymers have the general formula $(R_2SiO_2)_n$, where R is typically selected from OH, $C_{1-4}$ alkoxyl, $C_{1-4}$ alkyl and $C_{6-10}$ aryl, and wherein the R substituents on at least one Si are selected from $C_{1-4}$ alkyl and $C_{6-10}$ aryl, and n=2 to 200000. Such siloxane polymers are generally commercially available, such as from Dow Corning Corporation, or may be prepared by procedures known in the art.

The organic coating may be applied to the front side of the carrier substrate as a dry film or as a liquid composition. Dry film organic coatings may be applied (laminated) to the carrier substrate using any suitable lamination equipment, including vacuum lamination applicators. Liquid compositions of the organic coating may be disposed on the carrier substrate by any suitable means, such as such as spin-coating, slot-die coating, doctor blading, curtain coating, roller coating, spray coating, dip coating, and the like, with spin-coating and slot-die coating being preferred. Liquid compositions of the organic coating comprise one or more polymeric, preferably oligomeric, materials, one or more organic solvents, and optionally one or more additional additives, such as curing agents, cross-linking agents, flow additives, thickeners, and the like. The choice of organic solvent is within the ability of the person skilled in the art, and depends on the particular polymeric material employed, as well as any optional additives used. Exemplary solvents include, but are not limited to, toluene, xylene, mesitylene, alkylnaphthalenes, 2-methyl-1-butanol, 4-methyl-2-pentanol, gamma-butyrolactone, ethyl lactate, 2-hydroxyisobutyric acid methyl ester, propylene glycol methyl ether acetate, propylene glycol methyl ether, and mixtures thereof. Exemplary curing agents include thermal acid generators (TAGs), photoacid generators (PAGs), and photoinitiators. TAGs and their use are well-known in the art. Examples of TAGs include those sold by King Industries (Norwalk, Conn., USA) under NACURE™, CDX™ and K-PURE™ brand names. Photoacid generators (PAGs) and their use are well-known in the art and are activated upon exposure to a suitable wavelength of light or upon exposure to a beam of electrons (e-beam) to generate an acid. Suitable PAGs are available from a variety of sources, such as from BASF (Ludwigshafen, Germany) under the IRGACURE™ brand. Any suitable photoinitiator may be used, and may be readily identified by those skilled in the art.

The preparation of dry film materials is well-known in the art. Suitable dry film coating compositions of the invention may be prepared by any suitable means. Liquid coating compositions may be prepared by combining the polymeric material, organic solvent, and any optional additives in any order. It will be appreciated by those skilled in the art that the concentration of the components in the coating compositions may be varied across a wide range. Preferably, the polymeric material is present in the composition in an amount of from 2 to 40 wt %, preferably from 4 to 35 wt %, and more preferably from 5 to 30 wt %, based on the total weight of the coating composition. It will be appreciated by those skilled in the art that higher or lower amounts of the polymeric material may be used in the liquid coating compositions. The selection of the amounts of any optional additives is well within the ability of one skilled in the art.

If the organic coating layer on the carrier substrate is formed from a liquid composition, the organic coating layer is typically soft-baked to remove any remaining organic solvent. Suitable soft-baking temperatures and times are well-known to those skilled in the art. Exemplary soft-baking temperatures are in the range of 70 to 200° C., and preferably from 80 to 150° C. Exemplary soft-baking times are in the range of 0.5 to 20 min., and preferably from 1 to 10 min.

Optionally, the organic coating layer disposed on the carrier substrate may be cured. Curing the organic coating layer is preferred. Such curing may be accomplished by any suitable means, such as by heating the organic coating to a temperature sufficient to initiate curing, or heating the organic coating to a temperature sufficient to generate acid from a TAG to initiate curing, or exposing the organic coating to actinic radiation of an appropriate wavelength sufficient to generate acid from a PAG to initiate curing, or a combination thereof. In a preferred aspect of the present process, the organic coating layer is formed by disposing a coating composition comprising an oligomer and an organic solvent on the carrier substrate surface; removing the solvent; and curing the oligomer to form a cured organic coating. The organic coating layer on the carrier substrate may have any suitable thickness, such as from 50 nm to 100 μm, and preferably from 200 nm to 30 μm.

Next, a layer of one or more oxymetal precursor materials is disposed on the organic coating layer, wherein the oxymetal precursor material comprises one or more metal atoms and one or more ligands. Suitable oxymetal precursor materials may contain a single metal, or may contain two or more different metals. That is, a single oxymetal precursor material, such as an oligomer, may have only one metal species, or may contain 2 or more different metal species. Alternatively, a mixture of oxymetal precursor materials, each material having a single metal species, may be employed in order to deposit a mixed metal film. When a mixture of oxymetal precursor materials is used, the oxymetal precursor materials may comprise the same metal, or may comprise different metals. For example, when a first and a second oxymetal precursor are used in combination, each of the first and second precursors may comprise the same metal, or the first precursor may comprise a first metal, and the second precursor may comprise a second metal that is different from the first metal. Oxymetal precursor materials of the invention comprise a metal chosen from Group 3 to 14. The particular metal selected will depend on the heat capacity of the metal, the ability of the metal to absorb the wavelength of light used during the delamination step, and on other factors known to those skilled in the art. Preferably, the oxymetal precursor materials comprise a metal chosen from titanium, zirconium, hafnium, tungsten, tantalum, molybdenum, and aluminum, and more preferably from aluminum, titanium, molybdenum and tungsten. Any suitable ligand may be used in the oxymetal precursor materials of the invention, provided that such ligands can be cleaved during the curing step to form the oxymetal layer. Preferably, the ligand comprises one or more heteroatoms chosen from oxygen, nitrogen, sulfur or a combination thereof bound to, coordinated to, or otherwise interacting with the metal atom. More preferably, the ligand comprises one or more oxygen atoms. Suitable classes of ligands are those containing one or more of the following groups: alcohols, thiols, ketones, carboxylates, thiones, and imines, preferably alcohols, thiols, ketones, carboxylates and thiones, and more preferably alcohols, ketones, and carboxylates. Exemplary ligands include, but are not limited to: alkoxy, carboxylates, beta-diketonates, beta-hydroxyketonates, beta-ketoesters, beta-diketiminates, amindinates, guanidinates, and beta-hydroxyimines Preferred ligands include alkoxy, carboxylates, beta-diketonates, beta-hydroxyketones, and beta-ketoesters, and more preferably alkoxy, carboxylates, and beta-diketonates. Suitable ligands for the oxymetal precursor materials have from 1 to 20 carbon atoms, preferably from 1 to 12 carbons, yet more preferably from 1 to 10 carbons, still more preferably from 2 to 10 carbons, and even more preferably from 2 to 6 carbons. The oxymetal precursor may be composed of one or more ligands, each of which may be the same or different. For example, if the oxymetal precursor material comprises a tetravalent metal atom such that the precursor has 4 ligands, each of the ligands may be exactly the same as in $Ti(OC_4H_9)_4$, or the ligands may not be exactly the same but may belong to the same class as in $Ti(OC_2H_5)_2(OC_4H_9)_2$, or the ligands may belong to more than one class as in $Zr(OC_4H_9)_3$ acrylate.

A wide variety of oxymetal precursor materials may be used in the present invention. The oxymetal precursors are curable and may be polymeric or non-polymeric. Exemplary oxymetal precursors include, without limitation: (i) compounds of formula (1)

wherein M is a Group 3 to Group 14 metal; each L is a ligand independently chosen from light attenuating moieties, diketonates, ketiminates, $C_{2-20}$ polyols, $C_{1-20}$ alkoxides, $C_{1-20}$ alkylthiols, $C_{1-20}$ alkylcarboxylates, and $C_{7-20}$ arylcarboxylates; x refers to the number of ligands and is the valence of M; (ii) oligomers of the compounds of formula (1); (iii) oligomers having pendant groups comprising a Group 3 to Group 14 metal; (iv) compounds of formula (2)

wherein $R^1$=H or $CH_3$; M=a Group 3 to Group 14 metal; each $L^1$ is a ligand independently chosen from light attenuating moieties, diketonates, ketiminates, $C_{2-20}$ polyols, $C_{1-20}$ alkoxides, $C_{1-20}$ alkylthiols, $C_{1-20}$ alkylcarboxylates, and $C_{7-20}$ arylcarboxylates; and n refers to the number of ligands and is the valence of M; and (v) mixtures thereof. It is preferred that the oxymetal precursor is chosen from oligomers of the compounds of formula (1), oligomers having pendant groups comprising a Group 3 to Group 14 metal, and mixtures thereof. Preferably, M is chosen from titanium, zirconium, hafnium, tungsten, tantalum, molybdenum, aluminum, and silicon, and more preferably from titanium, tungsten, molybdenum and aluminum. It is preferred that L is chosen from diketonates, ketiminates, $C_{2-20}$ polyols, $C_{1-20}$ alkoxides, $C_{1-20}$ alkylthiols, $C_{1-20}$ alkylcarboxylates, and $C_{7-20}$ arylcarboxylates, more preferably from $C_{5-20}$ diketonates, $C_{5-20}$ ketiminates, $C_{2-20}$ polyols, $C_{1-20}$ alkoxides, $C_{1-20}$ alkylcarboxylates, and $C_{7-20}$ arylcarboxylates, and even more preferably from $C_{5-20}$ diketonates, $C_{2-20}$ polyols, $C_{1-20}$ alkoxides, $C_{3-12}$ alkylcarboxylates, and $C_{7-20}$ arylcarboxylates. $L^1$ is preferably chosen from light attenuating moieties, ketiminates, $C_{2-20}$ polyols, $C_{1-20}$ alkoxides, $C_{1-20}$ alkylcarboxylate, $C_{1-20}$ alkylthiols, and $C_{7-20}$ arylcarboxylates, more preferably from $C_{5-20}$ diketonate, $C_{5-20}$ ketiminate, $C_{2-20}$ polyols, $C_{1-20}$ alkoxides, $C_{1-20}$ alkylcarboxylates, $C_{1-20}$ alkylthiols, and $C_{7-20}$ arylcarboxylates, yet more preferably from $C_{5-20}$ diketonates, $C_{5-20}$ ketiminates, $C_{2-20}$ polyols, $C_{1-20}$ alkoxides, and $C_{1-20}$ alkylcarboxylate, and even more preferably from $C_{5-20}$ diketonates, $C_{2-20}$ polyols, and $C_{1-20}$ alkoxides. It is preferred that x is an integer of from 1 to 4.

Preferred oxymetal precursors of formula (1) are those where M is chosen from titanium, zirconium, hafnium, tungsten, tantalum, molybdenum, aluminum, and silicon, and where each L is independently chosen from $C_{5-20}$ diketonates, $C_{5-20}$ ketiminates, $C_{2-20}$ polyols, $C_{1-20}$ alkoxides, $C_{1-20}$ alkylcarboxylates, and $C_{7-20}$ arylcarboxylates. Even more preferred oxymetal precursors of formula (1) are those where M is chosen from titanium, zirconium, hafnium, tungsten, tantalum, molybdenum, and aluminum, and where L is chosen from $C_{5-20}$ diketonates, $C_{2-20}$ polyols, $C_{1-20}$ alkoxides, and $C_{1-20}$ alkylcarboxylates. One preferred class of oxymetal precursors of formula (1) are aluminum precursors of the formula $AlL^2{}_zL^3{}_y$, (formula 1a); wherein $L^2=C_{1-6}$ alkoxy; $L^3=C_{5-20}$ β-diketonate or $OR^2$; $R^2$=optionally substituted $C_{4-10}$ hydrocarbyl moiety; z is an integer from 0 to 2; y is an integer from 1 to 3; and z+y=3. In formula (1a), it is preferred that z=0 or 1, and more preferably 0. One or more hydrogen atoms of the $C_{4-10}$ hydrocarbyl moiety may be replaced with one or more substituents selected from the group consisting of hydroxyl, carboxylic acid and $C_{1-6}$ alkylcarboxylate. It is preferred that $L^2=C_{1-4}$ alkoxy. Another preferred class of oxymetal precursors of formula (1) are silicon precursors of the formula $Si(OR^3)_4$ (formula 1b), wherein each $R^3$ is independently a hydrocarbyl group having at least 10 carbons, and preferably having from 10 to 20 carbon atoms. It will be appreciated by those skilled in the art that more than one oxymetal precursor of formula (1) material may be used in the present invention. When combinations of such materials are used, such materials may be used in varying amounts, such as from 99:1 to 1:99 by weight, and preferably from 90:10 to 10:90 by weight. Preferably, combinations of oxymetal precursor materials are not used.

Exemplary oxymetal precursor materials of formula (1) include, but are not limited to: hafnium 2,4-pentanedionate; hafnium di-n-butoxide (bis-2,4-pentanedionate); hafnium tetramethylheptanedionate; hafnium trifluoropentanedionate; titanium allylacetoacetonate tris-iso-propoxide; titanium di-n-butoxide (bis-2,4-pentanedionate); titanium di-iso-propoxide (bis-2,4-pentanedionate); titanium di-iso-propoxide (bis-tetramethylheptanedionate); tantalum (V) tetraethoxide 2,4-pentanedionate; zirconium di-n-butoxide (bis-2,4-pentanedionate; zirconium di-iso-propoxide (bis-2,4-pentanedionate); zirconium dimethacrylate di-n-butoxide; zirconium tetramethacrylate; zirconium hexafluoropentanedionate; zirconium tetra-2,4-pentanedionate; zirconium 2,2,6,6-tetramethyl-3,5-heptanedionate; and zirconium trifluoropentanedionate. Such non-polymeric oxymetal precursor materials are generally commercially available or may be prepared by a variety of known methods.

Preferred oligomers of the compounds of formula (1) are those of formula (3)

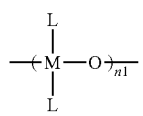

(3)

wherein M and L are as defined above for formula (1) and n1 is the number of repeat units. Typically, n1=2 to 100. Such oligomers of formula (3) may have any suitable end group, such as OH, H, L, $OR^6$ or $R^6$, wherein $R^6$ is a $C_{1-20}$ hydrocarbyl moiety. In one preferred oligomer of the precursor of formula (1), at least one L is a diketonate formed from a diketone of the structure

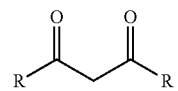

where each R is independently chosen from: hydrogen; $C_{1-12}$ alkyl, $C_{6-20}$ aryl, $C_{1-12}$ alkoxy, and $C_{6-10}$ phenoxy, and more preferably both L substituents are diketonates. More preferably, each R is independently chosen from $C_{1-10}$ alkyl, $C_{6-20}$ aryl, $C_{1-10}$ alkoxy, and $C_{6-10}$ phenoxy. Exemplary groups for R include methyl, ethyl, propyl, butyl, pentyl, hexyl, benzyl, phenethyl, naphthyl; phenoxy, methylphenoxy, dimethylphenoxy, ethylphenoxy and phenyloxymethyl. A preferred structure of the oligomer of the precursor of formula (1) has the formula (3a)

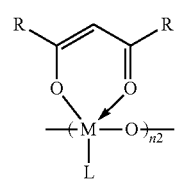

(3a)

where M, L and R are as described above and n2 is the number of repeat units. Typically, n2=2 to 100. Such oligomers of formula (3a) may have any suitable end group, such as OH, H, L, $OR^6$ or $R^6$, wherein $R^6$ is a $C_{1-20}$ hydrocarbyl moiety. Such oligomers are disclosed in U.S. Pat. No. 7,364,832. Similar metal-oxygen oligomers which are also useful in the present invention are found in U.S. Pat. Nos. 6,303,270; 6,740,469; and 7,457,507, and in U.S. Pat. App. Pub. No. 2012/0223418. Another preferred oligomer of the precursors of formula (1) is shown by formula (3b)

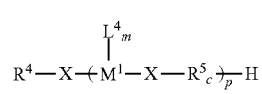

(3b)

wherein $R^4=C_{1-6}$ alkyl; $M^1$ is a Group 3 to Group 14 metal; $R^5=C_{2-6}$ alkylene-X— or $C_{2-6}$ alkylidene-X—; each X is independently chosen from 0 and S; c is an integer from 1-5; $L^4$ is a ligand; m refers to the number of ligands and is an integer from 1-4; and p=an integer from 2 to 25. It is preferred that $R^4$ is $C_{2-6}$ alkyl, and more preferably $C_{2-4}$ alkyl. Preferably, $M^1$ is a metal chosen from Groups 4, 5, 6 and 13, and more preferably from Groups 4, 5 and 6. It is preferred that $M^1$=titanium, zirconium, hafnium, tungsten, tantalum, molybdenum, and aluminum, and more preferably titanium, zirconium, hafnium, tungsten, tantalum, and molybdenum. X is preferably O. It is preferred that $R^5$ is chosen from $C_{2-4}$ alkylene-X— and $C_{2-4}$ alkylidene-X—, and more preferably from $C_{2-4}$ alkylene-O— and $C_{2-4}$ alkylidene-O—. Preferably, p=5-20, and more preferably 8-15. It is preferred that c=1-4, and more preferably c=1-3. $L^4$ is preferably chosen from one or more of $C_{1-6}$ alkoxy, beta-diketonates, beta-hydroxyketonates, and beta-ketoesters, and more preferably $L^4$ is chosen from beta-diketonates, beta-hydroxyketonates, and beta-ketoesters. Preferred ligands for $L^4$ include: benzoylacetonate; pentane-2,4-dionate (acetoacetate); hexafluoroacetoacetate; 2,2,6,6-tetramethylheptane-3,5-dionate; and ethyl-3-oxobutanoate (ethylacetoacetate). The number of ligands is referred to in formula (3b) by "m," which may be from 1 to 4, and preferably from 2 to 4. Oligomers of formula (3b) may be prepared by conventional means known in the art, such as those disclosed in U.S. Pat. No. 8,795,774.

Oligomers having pendant groups comprising a Group 3 to Group 14 metal useful as oxymetal precursor materials may be comprised of polymerized units of a single monomer (homopolymer) or polymerized units of a mixture of 2 or more monomers (copolymer). Suitable copolymers may be prepared by conventional methods by polymerizing one or more monomers comprising a metal-containing pendant group with one or more other monomers, such other monomers may optionally comprise a metal-containing pendant group, such as is disclosed in U.S. Pat. No. 8,795,774. Suitable ethylenically unsaturated monomers include, without limitation, alkyl (meth)acrylate monomers, aryl (meth)acrylate monomers, hydroxyalkyl (meth)acrylate monomers, alkenyl (meth)acrylates, (meth)acrylic acid, and vinyl aromatic monomers such as styrene and substituted styrene monomers. Preferably, the ethylenically unsaturated monomers are chosen from $C_{1-12}$ alkyl (meth)acrylate monomers and $C_{1-12}$ hydroxyalkyl (meth)acrylate monomers, and more preferably $C_{1-12}$ alkyl (meth)acrylate monomers and $C_{2-6}$ hydroxyalkyl (meth)acrylate monomers. Such copolymers may be random, alternating or block copolymers. These oligomers may be composed of, as polymerized units, 1, 2, 3, 4 or more ethylenically unsaturated monomers in addition to the monomer comprising the metal-containing pendant group, such as a metal-containing (meth)acrylate monomer.

In oxymetal precursor materials of formula (2), it is preferred that $L^1$ is chosen from one or more of $C_{1-6}$ alkoxy, beta-diketonates, beta-hydroxyketonates, beta-ketoesters, beta-diketiminates, amindinates, guanidinates, and beta-hydroxyimines. It is more preferred that $L^1$ is chosen from one or more of $C_{1-6}$ alkoxy, beta-diketonates, beta-hydroxyketones, and beta-ketoesters, and yet more preferably $L^1$ is chosen from $C_{1-6}$ alkoxy. The number of ligands is referred to in formula (2) by "n", which is an integer from 1 to 4, preferably from 2 to 4, and more preferably from 3 or 4. Preferred precursor materials of formula (2) are $Zr(C_{1-4}$ alkoxy$)_3$ acrylate, $Zr(C_{1-4}$ alkoxy$)_3$ methacrylate, $Hf(C_{1-4}$ alkoxy$)_3$ acrylate, $Hf(C_{1-4}$ alkoxy$)_3$ methacrylate, $Ti(C_{1-4}$ alkoxy$)_3$ acrylate, $Ti(C_{1-4}$ alkoxy$)_3$ methacrylate, $Ta(C_{1-4}$ alkoxy$)_4$ acrylate, $Ta(C_{1-4}$ alkoxy$)_4$ methacrylate, $Mo(C_{1-4}$ alkoxy$)_4$ acrylate, $Mo(C_{1-4}$ alkoxy$)_4$ methacrylate, $W(C_{1-4}$ alkoxy$)_4$ acrylate, and $W(C_{1-4}$ alkoxy$)_4$ methacrylate. The oxymetal precursor materials of formula (2) can be prepared by a variety of methods, such as by reacting a metal tetraalkoxide with acrylic or methacrylic acid in a suitable solvent, such as acetone.

After being deposited on the substrate, the oxymetal precursor material layer is optionally soft-baked at a relatively low temperature to remove any solvent and other relatively volatile components. Typically, the substrate is baked at a temperature of ≤125° C., preferably from 60 to 125° C., and more preferably from 90 to 115° C. The baking time is typically from 10 sec. to 10 min., preferably from 30 sec. to 5 min., and more preferably from 6 to 180 sec. Such baking step may be performed by in a suitable oven or on a hot plate.

Following the soft-baking step, the oxymetal precursor material layer is cured in an oxygen-containing atmosphere, such as air. The curing step is conducted by any suitable means such as on a hot plate-style apparatus or by oven curing. Typically, such curing is performed by heating the oxymetal precursor material layer at a curing temperature of ≥150° C., and preferably 150 to 400° C. It is more preferred that the curing temperature is ≥200° C., still more preferably ≥250° C., and even more preferably from 250 to 400° C. The curing time may be from 10 sec. to 10 min., preferably from 30 sec. to 5 min., more preferably from 45 sec. to 5 min., and yet more preferably from 60 to 180 sec. The choice of final curing temperature depends mainly upon the desired curing rate, with higher curing temperatures requiring shorter curing times. This curing step is performed in order to thermally decompose essentially all (that is, at least 95% by weight, and preferably at least 99% by weight) of the ligands and/or oligomer so that extremely high metal oxide-content films are formed. Typically, the amount of the metal in the cured metal oxide-containing films may be up to 95 mole % (or even higher), and preferably from 50 to 95 mole %. As used herein, the term "metal oxide film" (or "metal oxide layer") refers to a film comprising predominantly metal and oxygen, but may optionally contain up to 5 mole % carbon. Preferably, such metal oxide films comprise from 0 to 5 mole % carbon, more preferably from 0 to 3 mole %, and even more preferably from 0 to 2.5 mole % carbon. The cured oxymetal layer typically has a thickness of from 10 to 100 nm, preferably from 10 to 95 nm, and more preferably from 10 to 75 nm.

When the present oxymetal precursor material layers are cured at temperatures ≥200° C., the resulting metal oxide-containing films are resistant to stripping (being removed) by solvents conventionally used in the application of anti-reflective coatings and photoresists. When the present oxymetal precursor material layers are cured at temperatures ≥350° C., the resulting metal oxide-containing films are also resistant to stripping by alkaline or solvent developers conventionally used in the development of imaged photoresist layers.

The soft-baking step may not be necessary if the curing step is conducted in such a way that rapid evolution of the solvents and curing by-products are not allowed to disrupt the film quality. For example, a ramped bake beginning at relatively low temperatures and then gradually increasing to the range of 250 to 400° C. can give acceptable results. It can be preferable in some cases to have a two-stage curing process, with the first stage being a lower bake temperature of less than 250° C., and the second stage being a higher bake temperature preferably between 250 and 400° C.

While not wishing to be bound by theory, it is believed that the conversion of the oxymetal precursor to metal oxide involves its hydrolysis by moisture that is contained in the coating and/or adsorbed from the atmosphere during the deposition (casting) and curing processes. Therefore, the curing process is preferably carried out in air or in an atmosphere where moisture is present to facilitate complete conversion to metal oxide. The curing process can also be aided by exposure of the coating to ultraviolet radiation, preferably in a wavelength range of from about 200 to 400 nm. The exposure process can be applied separately or in conjunction with a thermal curing process.

In an alternative process, both the organic coating layer and the oxymetal precursor layer may be formed from a single deposition step. Preferably, such a single deposition step is used to form both the organic coating layer and the oxymetal precursor layer. Such single deposition process uses a coating composition comprising an oligomeric organic coating material, an oxymetal precursor material having a surface energy of 20 to 40 erg/cm$^2$, and an organic solvent, wherein the oligomeric organic coating material has a surface energy that is higher than the surface energy of the oxymetal precursor material. Any of the oligomer organic coating materials discussed above may suitably be used in these compositions, provided that such oligomer organic coating materials are capable of being cured, have a surface energy higher than the surface energy of the oxymetal precursor material used, are soluble in the organic solvent used, are stable under conditions used to dispose a layer of the composition on a substrate, and when cured have sufficient thermal stability to withstand the curing temperature of the oxymetal precursor material. The oligomeric organic coating material used in these compositions has a surface energy that is higher then the surface energy of the oxymetal precursor material. Preferably, the oligomeric organic coating material has a surface energy that is $\geq 10$ ergs/cm$^2$ higher than the surface energy of the oxymetal precursor material used, and more preferably has a surface energy that is $\geq 15$ ergs/cm$^2$ higher. Preferred oligomeric organic coating precursor materials useful in these single step deposition process compositions include, without limitation: polyarylene materials such as polyphenylene materials and arylcyclobutene-based materials, such as those available under the SiLK™ and CYCLOTENE™ brands, respectively. Such oligomeric coating materials are generally commercially available, or may be prepared by various known methods. Any of the organic solvents described above may be used in these coating compositions.

A wide variety of oxymetal precursor materials may suitably be employed in the present coating compositions for use in a single deposition step process, provided that such oxymetal precursor materials are capable of forming a film, capable of being cured, have a (static) surface energy of 20 to 40 erg/cm$^2$, and are soluble in the organic solvent used. Preferably, the oxymetal precursor materials have a (static) surface energy in the range of 20 to 35 erg/cm$^2$, and more preferably 20 to 30 erg/cm$^2$. The oxymetal precursor materials of the present invention are different from the oligomeric organic coating materials.

Single deposition step coating compositions may be prepared by combining the oligomeric organic coating material, the oxymetal precursor material, organic solvent, and any optional additives described above in any order. It will be appreciated by those skilled in the art that the concentration of the components in the present compositions may be varied across a wide range. Preferably, the oligomeric coating composition material is present in the composition in an amount of from 2 to 20 wt %, preferably from 4 to 15 wt %, and more preferably from 6 to 10 wt %, based on the total weight of the coating composition. Preferably, the oxymetal precursor material is present in the composition in an amount of from 3 to 25 wt %, more preferably from 5 to 20 wt %, and yet more preferably from 5 to 15 wt %, relative to the solid content of the oligomeric coating composition. It will be appreciated by those skilled in the art that higher or lower amounts of such components may be used in the present coating compositions.

The single deposition step coating compositions may be disposed on a carrier substrate by any of the methods described above for liquid compositions, such as by spin-coating, slot-die coating, doctor blading, curtain coating, roller coating, spray coating, dip coating, and the like. Spin-coating and slot-die coating are preferred. While not wishing to be bound by theory, it is believed that the oxymetal precursor material migrates toward the surface of the forming film during deposition of these compositions and during any subsequent solvent removal step. It is believed that the relatively low surface energy of the oxymetal precursor material helps drive the oxymetal precursor material to the air interface. As a result, a multilayer structure is obtained where a layer of the oxymetal precursor material is disposed on a layer of the oligomeric organic coating material. While some intermixing of the layers may be present, the top portion of the structure will be comprised of a majority of the oxymetal precursor material while the bottom portion will be comprised of a majority of the oligomeric organic coating material. It will be appreciated by those skilled in the art that such migration of the oxymetal precursor material should substantially occur before the complete curing of the oligomeric organic coating material. The formation of a cured organic coating material film substantially prohibits migration of the oxymetal precursor material.

During or after the deposition of the coating compositions on a carrier substrate to form a multilayer structure (oxymetal precursor material layer on an organic coating material layer), the structure is optionally soft-baked at a relatively low temperature to remove any remaining solvent and other relatively volatile components, as generally described above. Following any soft-baking step, the multilayer structure layer is cured, such as in an oxygen-containing atmosphere, such as air, or in an inert environment, such as in nitrogen, to form an oxymetal layer. The curing step is conducted preferably on a hot plate-style apparatus, though oven curing may be used to obtain equivalent results. The curing conditions described above may suitably be used. The initial baking step may not be necessary if the final curing step is conducted in such a way that rapid evolution of the solvents and curing by-products is not allowed to disrupt the film quality. For example, a ramped bake beginning at relatively low temperatures and then gradually increasing to the range of 250 to 400° C. can give acceptable results. It can be preferable in some cases to have a two-stage curing process, with the first stage being a lower bake temperature of less than 250° C., and the second stage being a higher bake temperature preferably between 250 and 400° C.

Following curing the oxymetal precursor material layer to form an oxymetal layer, a flexible substrate material is disposed on the oxymetal layer. Any flexible substrate material may be used, and is typically a flexible organic substrate material. Suitable flexible substrate materials have a glass transition temperature ($T_g$) above the thin film transistor (TFT) processing temperature used and have a coefficient of thermal expansion (CTE) that is relatively similar to that of the carrier substrate employed, such as in the range of 5 to 10 ppm/° K. Suitable flexible substrate materials include polyimides, polyimidebenzoxazoles, and combinations thereof. The flexible substrate material may be disposed on the oxymetal layer by any suitable means, such as by any of the methods described above. After being disposed on the oxymetal layer, the flexible substrate is typically cured. For example, when the flexible substrate is a polyimide, it may be cured at a temperature of 200 to 400° C. for a period of time up to several hours. Typically, the flexible substrate layer has a thickness of from 1 to 100 µm, and preferably from 1 to 50 µm. Next, the flexible substrate is subjected to various processing steps known in the art to form one or more devices on the flexible substrate. Such devices may include active and passive devices, such as transistors, emissive layers, and the like. Such processing steps may include various patterning processes including lithographic processes, metal deposition processes, barrier layer and dielectric layer formation processes, etching processes, cleaning processes, and the like. An exemplary display device is composed of a flexible substrate layer, a transistor array layer disposed on the flexible substrate layer, an organic light emitting diode (OLED) layer disposed on the transistor array layer, and an encapsulation layer disposed on the OLED layer.

After the desired devices are formed on the flexible substrate, the display device (the flexible substrate having devices formed thereon) is separated from the carrier substrate. Such separation may be achieved by irradiating the back side of the carrier substrate with a laser to heat the oxymetal layer, and then mechanically separating the display device. Alternatively, such separation may be achieved by first irradiating the back side of the carrier substrate with a laser to heat the oxymetal layer, followed by thermally heating (without using a laser) the carrier substrate, and then mechanically separating the display device. Any suitable laser may be used to irradiate the back side of the carrier substrate, such as lasers having a wavelength of 308, 532 or 1064 nm. The term "back side" refers to the surface of the carrier substrate that is opposite to the front side, that is, the carrier substrate surface having the display device thereon.

Following irradiation, the display device is preferably separated from the carrier substrate, with the organic coating material layer and the oxymetal layer remaining with the carrier substrate, that is, the display device is preferably separated from the oxymetal layer. Alternatively, upon separation of the display device from the carrier substrate, the oxymetal layer and the organic coating material layer may separate from the carrier substrate and remain with the display device. In a further alternative, upon separation, the oxymetal layer may remain with the display device and the organic coating material layer may remain with the carrier substrate. In another alternative, a portion of the oxymetal layer and a portion of the organic coating material layer may remain with the carrier substrate, and a portion of each may remain with the display device. In any of these embodiments, the display device is removed from the carrier substrate, and any residue remaining on the carrier substrate may be removed using an appropriate polymer remover, such as a tetraalkylammonium hydroxide, allowing the carrier substrate to be reused in the process. Any residue of the oxymetal layer itself or in combination with the organic coating material layer remaining with the display device will have no affect on its performance. One skilled in the art will appreciate that the particular polymer for the organic coating material layer, the thickness of the organic coating material layer, the use of an adhesion promoter on the carrier substrate surface, the particular oxymetal precursor material, the particular flexible substrate material used, the thickness of the flexible substrate layer, among other parameters, will affect whether the organic coating material layer and the oxymetal layer remain with the carrier substrate upon separation of the display device. For example, treating a surface of the carrier substrate with an adhesion promoter before disposing a layer of the organic coating composition on it will increase the adhesion of the organic coating material to the carrier substrate. A relatively thinner flexible substrate layer as compared to the organic coating material layer may also facilitate separation of the display device with the organic material layer remaining with the carrier substrate.

Figure 1B:
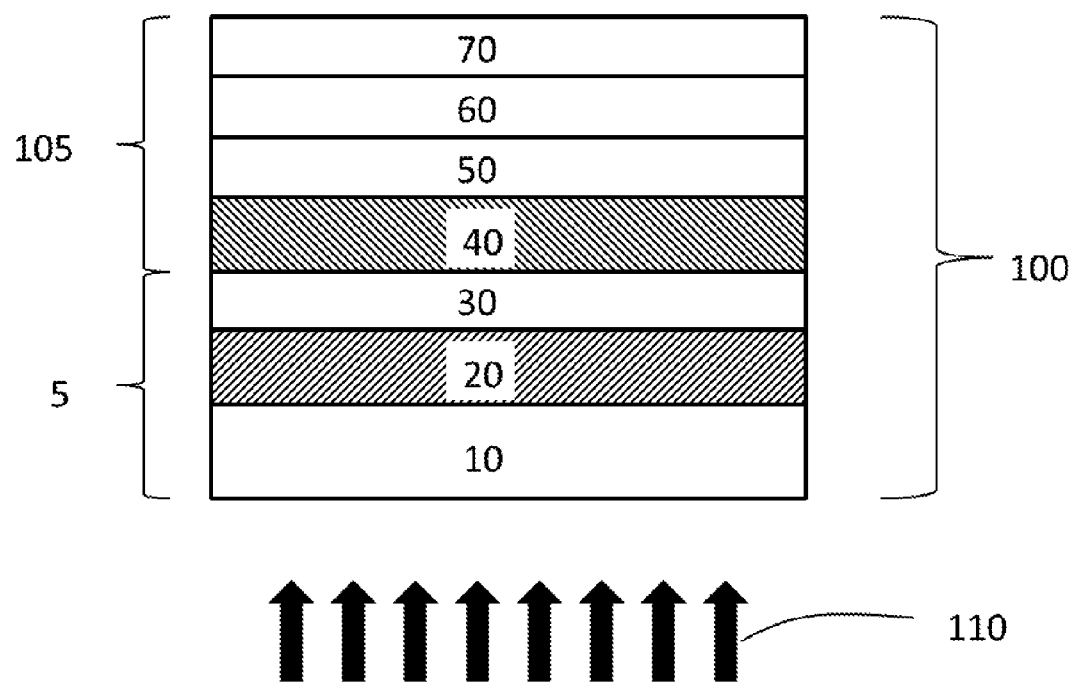
Figure 1C:
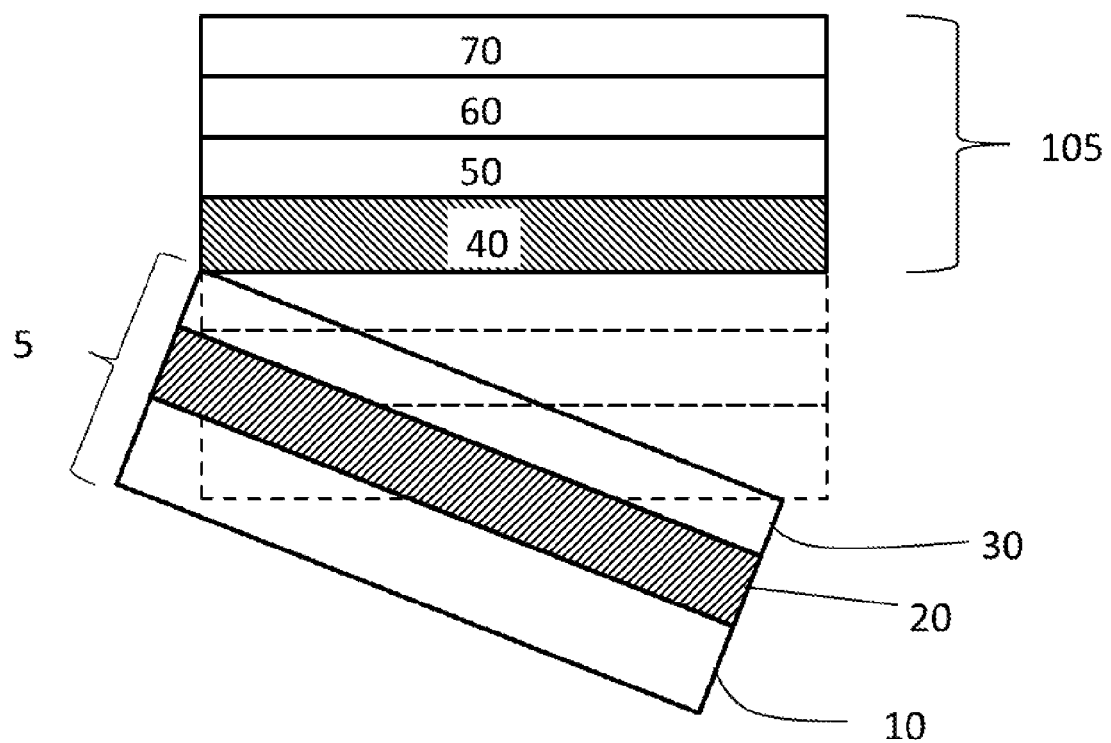
Figure 1D:
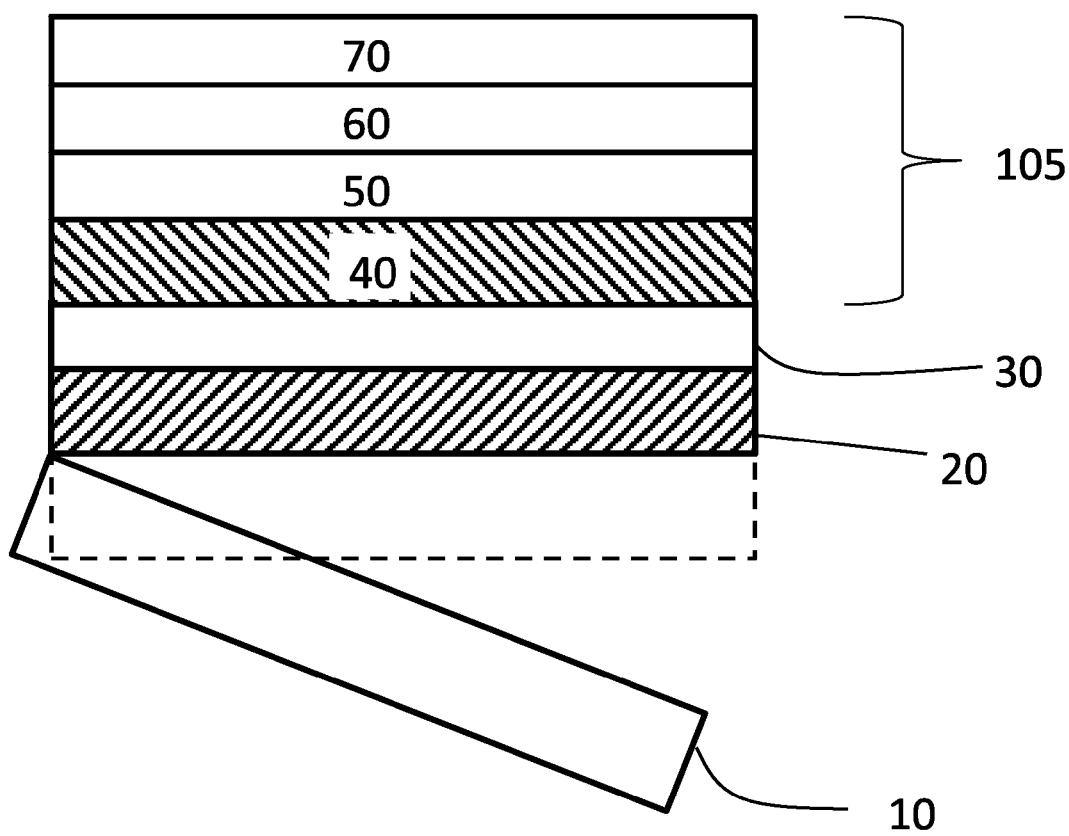

FIG. 1A illustrates a cross-sectional view of carrier structure 5 composed of carrier substrate 10, such as glass or plastic, having organic coating material layer 20, such as a polyphenylene material layer, disposed thereon, and an oxymetal layer 30 disposed on organic coating material layer 20. FIG. 1B illustrates a cross-sectional view of display devices structure 100 composed of flexible device structure 105 disposed on carrier structure 5, flexible device structure 105 being composed of, in order, flexible substrate layer 40, transistor array layer 50, OLED layer 60, and encapsulation layer 70, wherein flexible substrate layer 40 is disposed directly on oxymetal layer 30. Laser irradiation 110, such as at 532 nm wavelength, on the back side of carrier substrate 10 is used to detach flexible device structure 105 from carrier substrate structure 5. FIG. 1C illustrates a first embodiment of the invention showing the separation of carrier structure 5 from flexible device structure 105 following laser irradiation. FIG. 1D illustrates a second embodiment of the invention showing the separation of carrier substrate 10 from organic coating material layer 20. In the process of FIG. 1D, oxymetal layer 30 and organic coating material layer 20 remain with flexible device structure 105.

An advantage of the present process is that flexible display devices may be readily removed from carrier substrates. Also, following separation of the flexible display device, the oxymetal layer may be removed from the carrier substrate, thus allowing the carrier substrate to be reused. The presence of the organic coating disposed between the carrier substrate and the oxymetal layer allows for chemical removal of the oxymetal layer from the carrier substrate, such as by contacting the organic coating layer with any suitable polymer remover. A wide variety of polymer removers are known in the art, such as tetraalkyl ammonium hydroxides. Those skilled in the art will appreciate which polymer removers are suitable to remove the organic coating employed. As the organic coating is removed from the carrier substrate, so to is the oxymetal layer removed, thus providing a process for recycling the carrier substrate, or allowing the carrier substrate to be reused.

EXAMPLE 1

Into a 100 mL round bottom flask equipped with a magnetic stir bar were weighed 21.613 g of an oligomeric butyl titanate (24.5 mmoles, assuming average chain length of 4 titanium atoms) (available from Dorf Ketal under the Tyzor BTP brand) and 60.0 g of propylene glycol methyl ether acetate (PGMEA). The mixture was stirred to ensure a uniform solution before adding dropwise a solution of 29.5 g (204.6 mmoles) of octanoic acid in 60.0 g PGMEA to the flask. With continuous stirring, the temperature of the reactant mixture was brought to 60° C. and held at 60° C. for 2.5 hr. Then the heating was stopped and the reaction mixture was allowed to cool naturally to room temperature, and the solution was used as is.

Weight Loss Method:

Approximately 0.1 g of the titanium compound in solution was weighed into a tared aluminum pan. Approximately 0.5 g of the solvent used to form the titanium compound was added to the aluminum pan to dilute the test solution to make it cover the aluminum pan more evenly. The aluminum pan was heated in a thermal oven at approximately 110° C. for 15 min After the aluminum pan cooled to room temperature, the weight of the aluminum pan with dried solid film was determined, and the percentage solid content was calculated.

Following this weight loss procedure, the solution was found to contain 12.06% solids of an oligomeric octanoyl titanate.

EXAMPLE 2

12.0 g of aluminum tris-isopropoxide (or Al(Oi-Pr)$_3$) was mixed with 150.0 g of ethyl lactate in a 250 mL round bottom flask equipped with a magnetic stir bar and connected to a condenser and a thermocouple. With adequate stirring, the mixture in the flask was heated by way of a heating mantle which was controlled through the thermocouple. The mixture was heated to reflux temperature and maintained at reflux for 2 hr. Heating was then stopped and the mixture was allowed to cool naturally to room temperature with stirring. This ligand exchange reaction in excess ethyl lactate provided tris((1-ethoxy-1-oxopropan-2-yl)oxy)aluminum.

EXAMPLE 3

A mixed metal oligomer is prepared by combining 2 mmoles of an oligomeric butyl titanate (having an average chain length of 4 titanium atoms) (available from Dorf Ketal under the Tyzor BTP brand), 2 mmoles of tris((1-ethoxy-1-oxopropan-2-yl)oxy)aluminum from Example 2 in ethyl lactate, and 2 mmoles of DI water in a 250 mL round bottom flask. The reaction mixture is heated to 80° C. and held at 80° C. for 2 hr., after which time the reaction is stopped and the reaction mixture is allowed to cool to room temperature. The reaction mixture is then through a 1.0 µm perfluoropolyethylene (PFPE) filter to remove any insoluble materials, and then filtered through a 0.2 µm PFPE filter. A mixed titanium-aluminum oligomer is expected.

EXAMPLE 4

The procedure of Example 2 is repeated with similar results expected except that the aluminum tris-isopropoxide is replaced with zirconium tetra-n-butoxide, 80% in n-butanol (available from Gelest, Inc.), to provide tetrakis((1-ethoxy-1-oxopropan-2-yl)oxy)zirconium.

EXAMPLE 5

A mixed metal oligomer is prepared by combining 2 mmoles of an oligomeric butyl titanate (having an average chain length of 4 titanium atoms) (available from Dorf Ketal under the Tyzor BTP brand), 1 mmole of tetrakis((1-ethoxy-1-oxopropan-2-yl)oxy)zirconium from Example 4 in ethyl lactate, and 2 mmole of DI water in a 250 mL round bottom flask. The reaction mixture is heated to 80° C. and held at 80° C. for 2 hr., after which time the reaction is stopped and the reaction mixture is allowed to cool to room temperature. The reaction mixture is then through a 1.0 µm perfluoropolyethylene (PFPE) filter to remove any insoluble materials, and then filtered through a 0.2 µm PFPE filter. A mixed titanium-zirconium oligomer is obtained.

EXAMPLE 6

A polyphenylene oligomer was prepared according to the procedures of U.S. Patent Application Ser. No. 61/908,720, by reacting diphenylene oxide bis(triphenylcyclopentadienone) with 1.1 equivalents of 1,3-diethynylbenzene in ethoxybenzene. The resulting oligomer had a weight average molecular weight ($M_w$) of 23,000 Da.

EXAMPLE 7

A coating composition sample was prepared by combining the oligomeric octanoyl titanate of Example 1 with the polyphenylene oligomer of Example 6 in PGMEA. The amount of the polyphenylene oligomer was 6 wt %, and the amount of the oligomeric octanoic titanate was 6 wt % relative to the amount of the polyphenylene oligomer. The solution also contained 5% gamma-buyrolactone as a cosolvent to facilitate migration of the oligomeric octanoic titanate to the surface of the polyphenylene oligomer during spin coating. The coating composition was spin-coated (1500 rpm) on a 200 mm bare silicon wafer. After coating, the wafer was cured at 400° C. for 1 hr. to form an oxymetal layer on the surface of the cured polyphenylene layer. Next, a polyphenylene oligomer layer was coated on the oxymetal layer using the polyphenylene oligomer from Example 6. The wafer was then again cured at 400° C. for 1 hr. to form a cured polyphenylene film on the oxymetal layer.

The coating composition was then irradiated using a pulsed ArF laser (193 nm). The exposed area dimension was 1.5 cm×1.5 cm (or 2.25 cm$^2$), and 180 mJ energy was applied; resulting in 80 mJ/cm$^2$ energy applied to the cured polyphenylene film surface. After irradiation, the wafer was baked at 300° C. for 10 min. A cross-hatch adhesion test was performed following ASTM standards D2197 and D3359. A lattice pattern test area was then cut into the exposed polyphenylene film using a cross-hatch cutter. Any loose film particles were then removed from the lattice patterned test area. Scotch™ brand 600 tape (available from 3M, Minneapolis, Minn.) was then firmly applied over the lattice pattern and removed quickly by pulling the tape back off of the test area to reveal the amount of film removed by the tape. Visual inspection of the test area found moderate film loss indicating that laser irradiation successfully weakens the adhesion of the polyphenylene film to the coating composition.

EXAMPLE 8

A coating composition is prepared by combining the oligomeric octanoyl titanate of Example 1 with the polyphenylene oligomer of Example 6 in PGMEA. The amount of the oligomeric octanoyl titanate is 15 wt %. This coating composition is disposed on a glass carrier substrate using a slot-die coater. The coated carrier substrate is then baked at 400° C. for 50 min. to provide a carrier substrate having an organic coating layer with an oxymetal layer formed on the organic coating layer. A polyimide flexible substrate material is then disposed on the oxymetal layer using a slot-die coater. The polyimide layer is then cured under conventional conditions. The polyimide layer is then subjected to various processing conditions to form one or more display devices on the polyimide layer. Following formation of the desired display devices, the back side of the glass carrier substrate is exposed to a laser having a wavelength of 308 nm After exposure, the display device is baked at a temperature of 300° C. Following heating, the display device is expected to separate from the carrier substrate. The sacrificial layer, that is, the organic coating layer and the oxymetal layer, is expected to substantially (>95%) remain with the carrier substrate. The organic coating layer and the oxymetal layer are then expected to be removed from the glass carrier substrate by contacting the organic coating layer with tetramethylammonium hydroxide, followed by rinsing with DI water.

EXAMPLE 9

The procedure of Example 8 is repeated with similar results expected except that the laser has a wavelength of 532 nm.

EXAMPLE 10

The procedure of Example 8 is repeated with similar results expected except that the mixed titanium-aluminum oligomer of Example 3 is used in an amount of 10 wt %.

EXAMPLE 11

A layer of the polyphenylene oligomer of Example 6 is disposed on a glass carrier substrate by slot-die coating. The organic coating is then cured at 400° C. for 60 min. Next, an oxymetal layer is formed on the cured polyphenylene coating by disposing a layer of the mixed titanium-aluminum oligomer of Example 3 using a slot-die coater, followed by curing at 400° C. for 30 min A polyimide flexible substrate material is then disposed on the oxymetal layer by slot-die coating. The polyimide layer is then cured under conventional conditions. The polyimide layer is then subjected to various processing conditions to form one or more display devices on the polyimide layer. Following formation of the desired display devices, the back side of the glass carrier substrate is exposed to a laser having a wavelength of 308 mm After exposure, the display device is baked at a temperature of 300° C. Following heating, the display device is expected to separate from the carrier substrate. The sacrificial layer, that is, the organic coating layer and the oxymetal layer, is expected to substantially (>95%) remain with the carrier substrate. The organic coating layer and the oxymetal layer are then expected to be removed from the glass carrier substrate by contacting the organic coating layer with tetramethylammonium hydroxide, followed by rinsing with DI water.

EXAMPLE 12

The procedure of Example 11 is repeated with similar results expected except that the oligomeric octanoyl titanate of Example 1 is used in an amount of 6 wt % instead of the mixed titanium-aluminum oligomer.

What is claimed is:

1. A method of manufacturing a display device comprising: (a) providing a carrier substrate; (b) disposing a layer of an organic coating on a front surface of the carrier substrate; (c) disposing a layer of one or more oxymetal precursor materials on the organic coating layer, wherein the oxymetal precursor material comprises one or more metal atoms and one or more ligands; (d) curing the layer of oxymetal precursor material to form an oxymetal layer; (e) forming a flexible substrate layer on the oxymetal layer; (f) forming one or more devices on the flexible substrate layer; (g) irradiating a back surface of the carrier substrate with a laser to heat the oxymetal layer, and then (h) mechanically separating the flexible substrate layer from the carrier substrate.

2. The method of claim 1 wherein at least one metal atom is chosen from silicon, titanium, zirconium, hafnium, tungsten, tantalum, molybdenum, and aluminum.

3. The method of claim 1 wherein the organic coating layer is formed by disposing a coating composition comprising an organic oligomer and a solvent on the carrier substrate surface; removing the solvent; and curing the organic oligomer to form the organic coating.

4. The method of claim 1 wherein the organic coating layer is directly on the carrier substrate surface.

5. The method of claim 1 wherein the organic coating and layer of oxymetal precursor are formed by disposing a layer of a coating composition on the carrier substrate surface, wherein the coating composition comprises a matrix precursor material, an oxymetal precursor material having a surface energy of 20 to 40 erg/cm$^2$, and an organic solvent; subjecting the coating composition layer to conditions such that a layer of the oxymetal precursor material forms on a layer of the matrix precursor material; and curing the matrix precursor material to form the organic coating layer.

6. The method of claim 1 wherein the organic coating layer comprises a polymeric material chosen from arylene polymers, arylene ether polymers, imide polymers, siloxane polymers, styrene polymers, (meth)acrylate polymers, isobenzoxazole polymers, and mixtures thereof.

7. The method of claim 1 wherein the oxymetal precursor material is chosen from:
(i) compounds of formula (1)

$$ML_x \qquad (1)$$

wherein M is a Group 3 to Group 14 metal; each L is a ligand independently chosen from light attenuating moieties, diketonates, ketiminates, $C_{2-20}$ polyols, $C_{1-20}$ alkoxides, $C_{1-20}$ alkylthiols, $C_{1-20}$ alkylcarboxylates, and $C_{7-20}$ arylcarboxylates; x refers to the number of ligands and is the valence of M;
(ii) oligomers of the compounds of formula (1);
(iii) oligomers having pendant groups comprising a Group 3 to Group 14 metal;
(iv) compounds of formula (2)

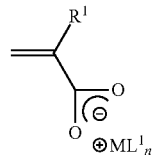

(2)

wherein $R^1$=H or $CH_3$; M=a Group 3 to Group 14 metal; $L^1$ is a ligand independently chosen from light attenuating moieties, diketonates, ketiminates, $C_{2-20}$ polyols, $C_{1-20}$ alkoxides, $C_{1-20}$ alkylthiols, $C_{1-20}$ alkylcarboxylates, and $C_{7-20}$ arylcarboxylates; and n refers to the number of ligands and is the valence of M; and
(v) mixtures thereof.

8. The method of claim 1 wherein the oxymetal layer is formed from two or more oxymetal precursor materials that are different from each other.

9. The method of claim 1 wherein the oxymetal layer has a thickness of from 10 to 20 nm.

10. The method of claim 1 further comprising thermally heating the carrier substrate following laser irradiation.

11. The method of claim 1 further comprising the step of treating the surface of the carrier substrate with an adhesion promoting composition prior to disposing the layer of the organic coating on the surface of the carrier substrate.

12. A method of manufacturing a display device comprising: (a) providing a carrier substrate; (b) disposing a layer of a coating composition on a front surface of the carrier substrate, wherein the coating composition comprises a matrix precursor material, an oxymetal precursor material, and an organic solvent, the oxymetal precursor material comprising one or more metal atoms and one or more ligands and having a surface energy of 20 to 40 erg/cm$^2$; (c) subjecting the coating composition layer to conditions such that a layer of the oxymetal precursor material forms on a layer of the matrix precursor material; (d) curing the matrix precursor material to form the organic coating layer; (e) curing the layer of oxymetal precursor material to form an oxymetal layer; (f) forming a flexible substrate layer on the oxymetal layer; (g) forming one or more devices on the flexible substrate layer; and (h) separating the flexible substrate layer from the carrier substrate.

13. The method of claim 12 wherein the step of separating the flexible substrate layer from the carrier substrate is achieved by irradiating the back side of the carrier substrate with a laser to heat the oxymetal layer, and then mechanically separating the flexible substrate layer.

* * * * *